United States Patent [19]

Tagawa

[11] Patent Number: 4,996,392
[45] Date of Patent: Feb. 26, 1991

[54] SUPERCONDUCTOR MAGNETIC IMAGE DETECTION DEVICE

[75] Inventor: Takao Tagawa, Kashihara, Japan

[73] Assignee: Sharp Kabushiki Kaisha, Osaka, Japan

[21] Appl. No.: 324,686

[22] Filed: Mar. 17, 1989

[30] Foreign Application Priority Data

Mar. 18, 1988 [JP] Japan ................................. 63-66310

[51] Int. Cl.⁵ .............................................. G08C 21/00
[52] U.S. Cl. ..................................... 178/18; 505/881; 338/32 S
[58] Field of Search ............................ 178/18, 20, 19; 505/881; 338/32 S

[56] References Cited

U.S. PATENT DOCUMENTS 3,259,866  7/1966  Miles et al. ........................ 338/32 S
3,264,617  8/1966  Feissel .............................. 338/32 S Primary Examiner—Stafford D. Schreyer

[57] ABSTRACT

A magnetic image detection device which measures a magnetic image in the first or second dimension by using a superconducting body. In the magnetic image detection device, multiple band-shaped superconducting bodies are provided in parallel on a nonmagnetic dielectric substrate, and electrodes are provided on both ends of the superconducting bodies so as to form pairs. A detection circuit detects resistance between the electrodes on both ends of the multiple superconducting bodies according to intensity of external magnetic field.

22 Claims, 7 Drawing Sheets

SUPERCONDUCTOR MAGNETIC IMAGE DETECTION DEVICE

BACKGROUND OF THE INVENTION

The present invention relates to a magnetic image detection device which measures magnetic distribution (magnetic image) in a first or second dimension.

Measurement of magnetic distribution is widely used in the development of devices which utilize a magnetic field, for example, electron beam polarizers, electron beam focusing devices, motors, developing units in copying machines, etc.

It would furthermore be extremely advantageous if the inspection and analysis of reinforcing rods in concrete blocks and other internal structural members could be performed by means of nondestructive tests using the measurement of magnetic distribution. In addition, it would also be extremely beneficial for the medical sciences if the distribution in one or two dimensions of minute magnetic fields emitted from the brain or heart could be measured.

Conventionally, the measurement of magnetic distribution in one or two dimensions has been accomplished as described below. Specifically, magnetic distribution has been obtained by mechanically moving a Hall element or other magnetic sensor and sequentially plotting the magnetic field intensity obtained by the magnetic sensor at each detection position.

Thus, because when measuring the magnetic distribution in one or two dimensions with a conventional device magnetic sensors are mechanically moved, the magnetic intensity occurring at each position is measured, and the magnetic field intensity obtained at each position is sequentially plotted as previously described, precision is low and much time is required for measurements. Additionally, it is not possible to measure magnetic distribution over time, specifically magnetic distribution in motion.

It is possible to align multiple Hall elements in order to correct the problems of low measurement precision and the long measurement time requirements. However, there is a limit to the density in which Hall elements can be arrayed, and high density array devices cannot be used. Moreover, because sensitivity of a Hall element is low, the magnetic distribution of weak magnetic fields cannot be detected.

SUMMARY OF THE INVENTION

It is therefore the object of the present invention to provide a magnetic image detection device which by means of a superconducting body is able to measure magnetic images in the first or second dimension with extremely high resolution, high precision, and with high speed.

In order to achieve the object, a magnetic image detection device according to the present invention includes one or more superconducting bodies placed on a nonmagnetic dielectric substrate. First electrodes and second electrodes, which are provided on the superconducting body to form multiple pairs. A detection circuit is included which detects electrical resistance between each of the first electrodes and second electrodes forming the pairs. Accordingly, a distribution in the first dimension of magnetism acting upon the superconducting body is detected by the detection circuit.

The device may also be structured such that the superconducting bodies are elongated in one direction and are arrayed at even intervals in a direction which intersects with the one direction. Also, the first electrodes and second electrodes are provided on both ends of the superconducting bodies.

Because the resistance between the first and second electrodes caused by an applied external magnetic field can be detected by the detection circuit, a magnetic image detection device according to the present invention is able to measure with high resolution, high precision, and at a high speed a magnetic image in one dimension.

Furthermore, in a preferred embodiment according to the present invention, the superconducting bodies are formed in a zig-zag pattern. With the zig-zag pattern the electrical resistance between the first and second electrodes is increased, and the detection sensitivity of the magnetic image can be increased.

Furthermore, it is also preferred that the superconducting bodies be divided into multiple blocks and, that the blocks are respectively connected to switches which switch the first electrodes of each of the blocks to a ground or a common power supply or a specified voltage. There are diodes and resistors operatively joined to each line connecting the second electrodes to a common power supply having the same voltage as that of the specified voltage. With the aforementioned structure the first electrodes of each of the blocks are successively connected by the switches to the ground, thereby detecting a magnetic distribution at each block.

Thus, multiple blocks can be connected to the detection circuit by means of a matrix structure, and each block can be successively switched by said switches to an operable state. Therefore, it is possible to detect magnetic images with higher resolution using a simple detection circuit.

Furthermore, a magnetic image detection device according to the present invention may also be structured with the superconducting bodies elongated to form a single stripe, and the first electrodes and second electrodes provided to intersect at even intervals and on top of the superconducting bodies.

In such an embodiment, the detection density of the magnetic image detection device is determined by the gap between the electrodes, which can be manufactured with high precision, and the detection precision can thus be further increased.

Furthermore, in order to achieve the object, a digitizer according to the present invention is includes a magnetic pen having a magnet installed inside a tip thereof. There are multiple first superconducting bodies provided on a surface of a nonmagnetic dielectric substrate, elongated in one direction and arranged at even intervals in a direction which intersects with the one direction. Multiple first electrodes are provided on one end of each of the multiple first superconducting bodies and multiple second electrodes provided on the other end of each of the multiple first superconducting bodies so as, to form pairs with the multiple first electrodes. Multiple second superconducting bodies provided on a back of the nonmagnetic dielectric substrate, elongated in the other direction and arranged at even intervals in the direction thus intersecting with the said other direction and such that the multiple second superconducting bodies are perpendicular to the first superconducting bodies. Multiple third electrodes are provided on one end of each of the multiple second superconducting bodies and multiple fourth electrodes are provided on the other end of each of the multiple second superconducting bodies so as to form pairs with the third electrodes. A detection circuit is included which detects electrical resistance between the first and second electrodes forming pairs and electrical resistance between the third and fourth electrodes forming pairs. With this structure changes in resistance of the first and second superconducting bodies caused by magnetic flux coming from the magnetic pen are detected by the detection circuit, and the second dimension position of the magnetic pen is detected.

Furthermore, a digitizer according to the present invention includes a magnetic pen having a magnet installed inside a tip thereof. Multiple first superconducting bodies provided on a surface of a nonmagnetic dielectric substrate, elongated in one direction and arranged at even intervals in a direction which intersects with the one direction. Multiple first electrodes are provided on one end of each of the multiple first superconducting bodies and multiple second electrodes provided on the other end of each of the multiple first superconducting bodies so as to form, pairs with the multiple first electrodes. Multiple second superconducting bodies are provided on a separate nonmagnetic dielectric substrate, elongated in the other direction and arranged at even intervals in the direction thus intersecting with the said other direction. Multiple third electrodes are provided on one end of each of the multiple second superconducting bodies and multiple fourth electrodes are provided on the other end of each of the multiple second superconducting bodies so as to form pairs with the third electrodes. There is included a detection circuit which detects electrical resistance between the first and second electrodes forming pairs and electrical resistance between the third and fourth electrodes forming pairs; back sides of both of the nonmagnetic dielectric substrates being applied together in such a manner that a direction in which the first superconducting bodies are arrayed and a direction in which the second superconducting bodies are arrayed are perpendicular. With the aforementioned structure changes in resistance of the first and second superconducting bodies caused by magnetic flux coming from the magnetic pen are detected by the detection circuit and the second dimension position of the magnetic pen are detected.

In each of the aforementioned cases, it is preferred that a sleeve of a superconducting body be provided around the magnet, thus reducing the diffusion of the magnetic field at the tip of the magnetic pen.

Thus, the diffusion of the magnetic field is reduced by the Meissner effect by the sleeve of a superconducting body, and precision is significantly improved.

Furthermore, it is preferred that the tip of the sleeve of a superconducting body be narrower at the end.

Thus, the waist of the magnetic flux, that is, a point at which the diameter of the magnetic flux is narrowest, can be positioned away from the tip of the magnetic pen. Therefore, detection precision does not drop even when a nonmagnetic shield plate is positioned between the superconducting body and the magnetic pen.

Furthermore, it is also preferred that a nonmagnetic body be injected into the space at the tip end side of the magnet in the sleeve of a superconducting body in such a manner as to protect the pen tip and to prevent the entry of foreign matter.

Furthermore, it is also preferred that a notch be provided in the long side of the superconducting sleeve to prevent a current cancelling the magnetic flux emitted by the magnet from flowing circumferentially around the sleeve and thus weakening the strength of the magnetic field.

Furthermore, the sleeve of a superconducting body may be formed with a superconducting wire material coated with an insulation material on the surface tightly wrapped in a helical pattern.

Furthermore, the sleeve of a superconducting body may be formed from a sheet of a superconducting material provided with an insulation material on one side and rolled multiple times.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENTS

Figure 15:
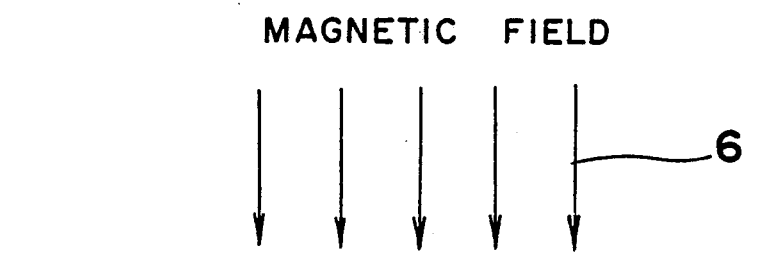
FIG. 15 is a structure of the principal relating to the present invention.

FIG. 15 is a structure of the principle relating to the present invention. Reference number 1 is a superconducting body, and numbers 2 and 3 are electrodes provided on both ends of the superconducting body 1. The resistance of the superconducting body 1 changes sensitively with changes in external magnetic field 6. Specifically, by changing external magnetic field 6 acting on this superconducting body 1 and measuring the resistance between the electrodes 2, 3, the characteristics plot shown in FIG. 16 can be obtained. Therefore, by measuring the resistance between electrode 2 and electrode 3, the strength of the external magnetic field with respect to superconducting body 1 can be measured with good sensitivity as illustrated by the relationship shown in FIG. 16.

Figure 1:
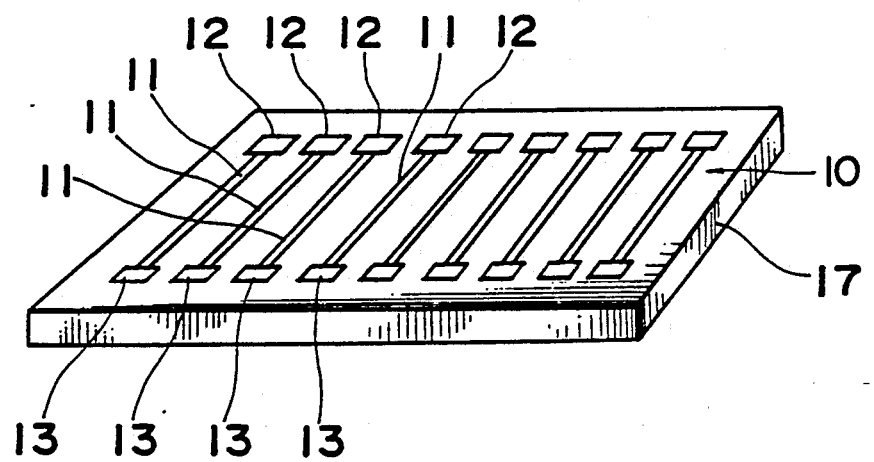
FIG. 1 is an oblique view of a first embodiment of a magnetic detection element relating to a magnetic image detection device according to the present invention.

Thus, a magnetic image detection device as shown in FIG. 1 is constructed using a superconducting body exhibiting the characteristics as described above.

Figure 2:
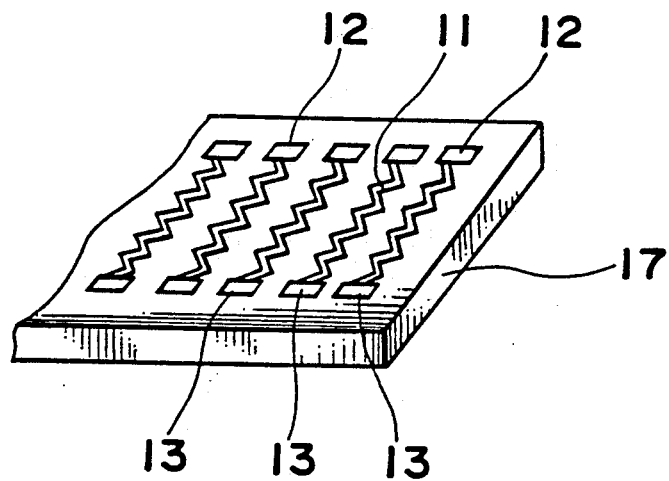
FIG. 2 is a figure showing an alternative implementation of the magnetic detection element.

In a magnetic image detection device as shown in FIG. 1, multiple striped superconducting bodies 11 are arranged in parallel on nonmagnetic dielectric substrate 17. According to a preferred embodiment, a ceramic plate is used as nonmagnetic dielectric substrate 17, and superconducting bodies 11 are formed in extremely fine bands on nonmagnetic dielectric substrate 17 using screen printing, etching, or other technology. Furthermore, as shown in FIG. 2, said superconducting bodies 11 may also be formed in a zig-zag pattern to increase the electrical resistance between electrodes 12 and electrodes 13 and thus increase the magnetic image detection sensitivity.

Figure 16:
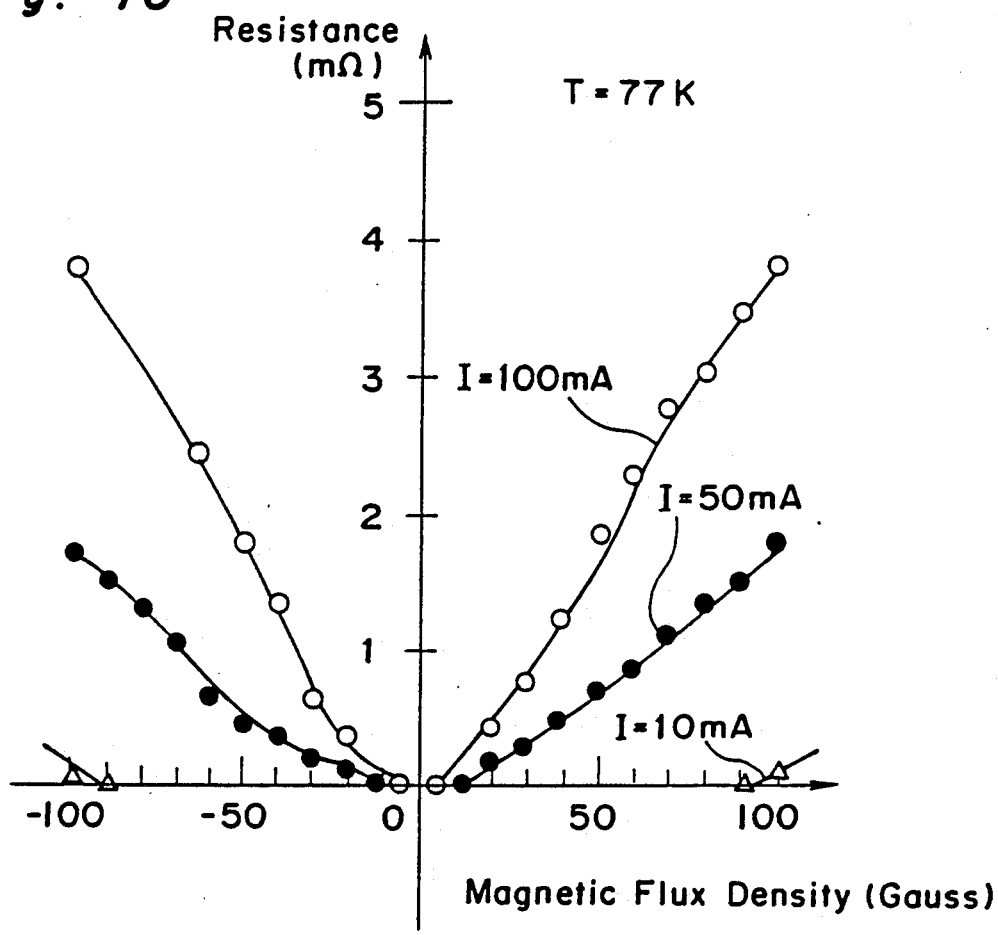
FIG. 16 is a graph of the external magnetic field and resistance characteristics in a superconducting body.

On both ends of the superconducting bodies 11 are provided electrodes 12 and electrodes 13 comprised of a metal, conductive paste, or other material. The superconducting bodies 11 and electrodes 12, 13 are formed with different processes. Thus, the resistance between these electrodes 12 and electrodes 13 exhibits the characteristics as shown in FIG. 16 and caused by changes in the external magnetic field.

Figure 3:
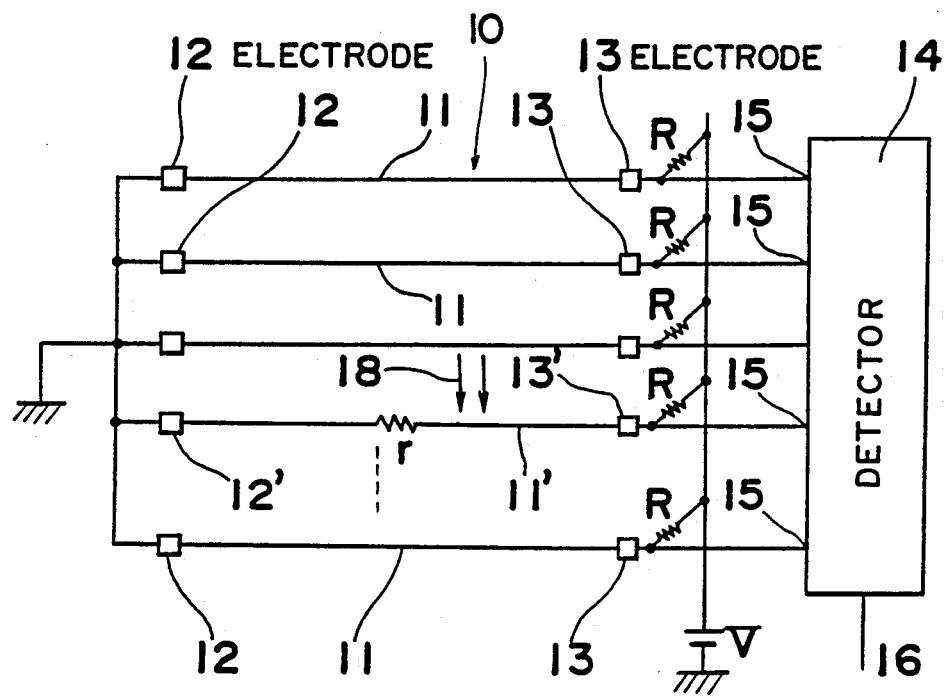
FIG. 3 is a circuit diagram showing a preferred embodiment of a magnetic image detection device according to the present invention.

Each of the electrodes 12 of superconducting body array 10 thus formed is connected to a common ground terminal as shown in FIG. 3, and a voltage V is applied to each of electrodes 13 via resistance R. Furthermore, each of electrodes 13 is also connected to input each of terminals 15 of detection circuit 14. The resistance R is formed by screen printing or another process on nonmagnetic dielectric substrate 17. The method of applying voltage to the electrodes 13 is not limited to the methods, and a voltage V may also be applied to electrodes 12 and electrodes 13 connected to a ground potential.

Moreover, the magnetic image detection device may also be comprised as described below. Specifically, though not shown in the figures, a CMOS (complimentary metal oxide semiconductor) may be used in all or part of detection circuit 14, and superconducting body 11 and detection circuit 14 may formed on the same substrate. Thus, because CMOS devices will operate even at the temperature of liquid nitrogen (77 degrees Kelvin), both the superconducting bodies 11 and CMOS can be cooled simultaneously. During the cooling, a liquid gas such as liquid nitrogen is preferable as the coolant in order to obtain a cooling temperature with good precision.

Production methods for a magnetic image detection device as thus described include the following.

According to a first method, the superconducting bodies 11 and CMOS are both formed on a single silicon wafer. The superconducting bodies 11 have a resistance sufficiently lower than that of the silicon wafer, and there is therefore no problem for practical applications. In this case, the CMOS is formed on the wafer using the same process as normal, and the superconducting bodies 11 are formed on the wafer with a spray or screen printing process, etc.

According to a second method, the superconducting bodies 11 are formed with a spray or screen printing process on an alumina or other insulated substrate, and heat treatment is provided as necessary. After this, a CMOS chip formed in a separate process is applied to the substrate with an adhesive. Then, the terminals of the CMOS chip and the terminals of the superconducting bodies 11 are connected with wire bonding or another process. According to this method, because the superconducting bodies 11 and CMOS can be produced in completely separate processes, each can be manufactured in a process optimized for the respective characteristics of each material.

A magnetic image detection device of the aforementioned construction operates as described below.

When the external magnetic field is 0 (zero), the resistance between electrodes 12 and electrodes 13 is 0 (zero) However, as shown in FIG. 3, when magnetic field 18 is in the vicinity of superconducting body 11', the resistance between electrode 12' and electrode 13' can expressed as r. Therefore, a voltage of r.V/R is generated at input terminal 15' of detection circuit 14. However, R is significantly greater than r. Therefore, the position of the superconducting body when resistance becomes r is known, and the magnetic distribution with respect to the direction of the orientation of superconducting bodies 11 in FIG. 3 can be detected with high sensitivity, high precision, and high speed by the detection signal from detection terminal 16.

Figure 4:
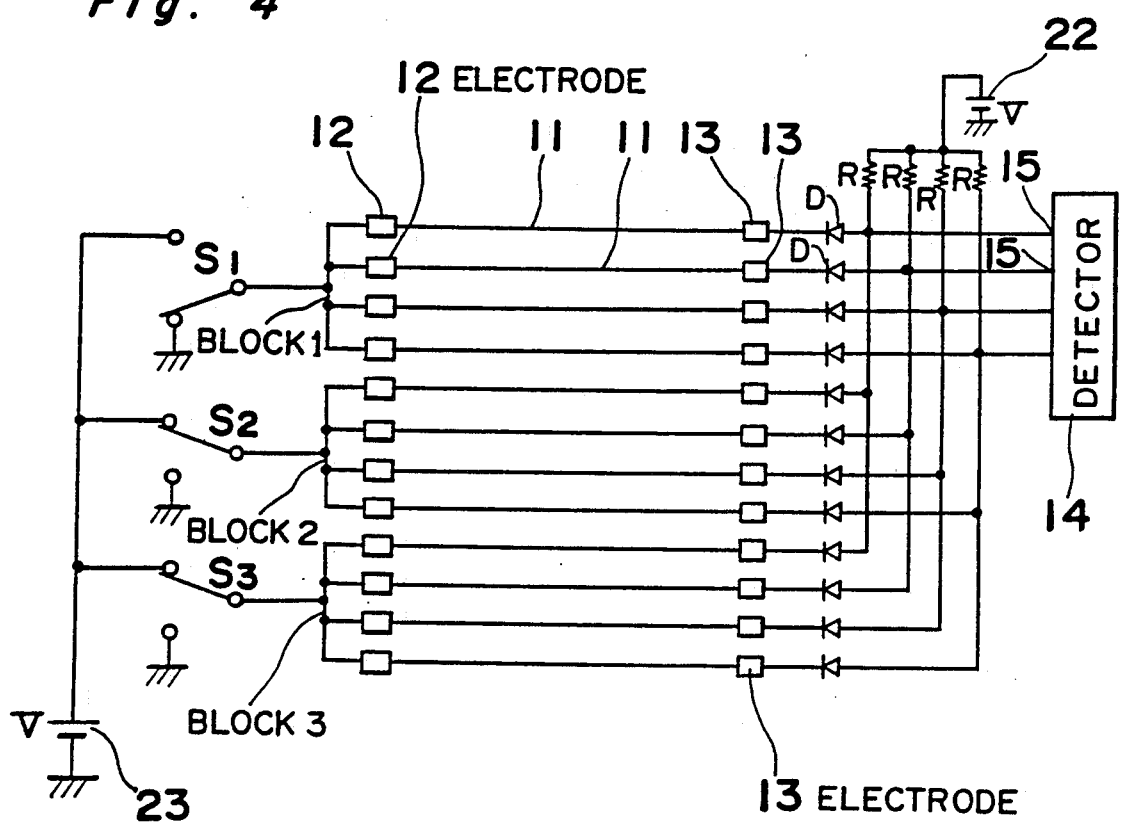
FIG. 4 is a circuit diagram showing another embodiment.

FIG. 4 is an implementation of a magnetic image detection device in which the density of the superconducting bodies 11 shown in the embodiment of FIG. 3 has been increased. In this magnetic image detection device, multiple magnetic image detection devices as shown in FIG. 3 have been arrayed in parallel (in the embodiment as shown there are three series, referred to in the description hereinbelow as block 1, block 2, and block 3, respectively, from the top of the figure). Each of the electrodes 12 in the block 1 is connected to switch S1, each of the electrodes 12 in the block 2 is connected to switch S2, and each of the electrodes 12 in the block 3 is connected to switch S3. Thus, one pole of each of switches S1, S2, and S3 is a ground, and the other pole is connected to power supply 23 of voltage V. Each of electrodes 13 of block 1, block 2, and block 3 is connected to input terminals 15 of detection circuit 14 via diode D. Moreover, each of electrodes 13 is connected to power supply 22 of voltage V via the diode D and resistance R. Therefore, of switches S1, S2, and S3, the electrodes 12 of the block connected to that switch which is switched to the ground are grounded. Thus, a voltage is generated when the external magnetic field is in the vicinity only between the electrodes 12 and electrodes 13 of that block which is grounded. Specifically, that block is in the operating state.

For the purposes of the example as described hereinbelow, it will be assumed that switch S1 is switched to the ground, switch S2 is switched to power supply 23, and switch S3 is also switched to power supply 23 as shown in FIG. 4. Thus, only the superconducting bodies 11 of block 1, which is connected to switch S1, are in the operating state. Then, when an external magnetic field is in the vicinity, a voltage is generated between electrodes 12 and electrodes 13 of superconducting bodies 11 of block 1. At this time, the effect of power supply 23 on block 1 through switches S2 and S3 is inhibited by each diode D in block 2 and block 3. Furthermore, the superconducting bodies 11 of block 2 and block 3 are non-operable because of the presence of power supply 23. Therefore, even in the event that the external magnetic field is present in the vicinity of the superconducting bodies 11 of block 2 and block 3, this external magnetic field is not detected.

By thus connecting block 1, block 2, and block 3 to detection circuit 14 with a matrix construction, block 1, block 2, and block 3 can be successively switched to the operating state by switch S1, switch S2, and switch S3, respectively. Therefore, magnetic images can be detected with high density using a simple detection circuit.

The switches S1, S2, and S3 are comprised of semiconductor elements, and can be electronically switched. Furthermore, the method of applying voltage V to electrodes 13 is not limited to the method as described with FIG. 4.

Figure 5:
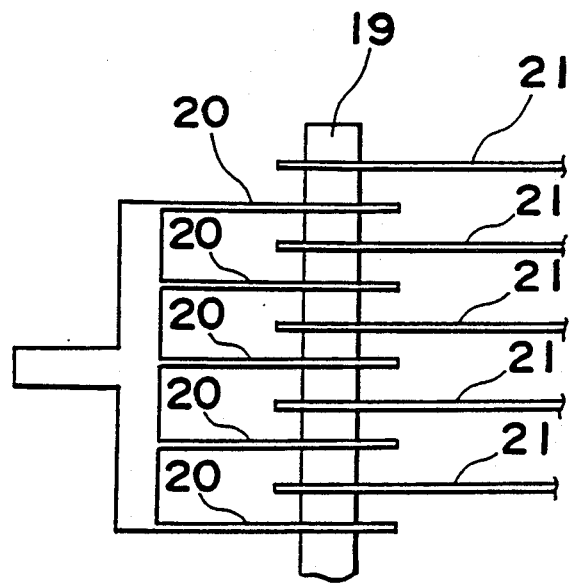
FIG. 5 is a summary diagram of a magnetic detection element according another embodiment of the present invention.

FIG. 5 shows an alternative embodiment of electrodes 12, 13 in a magnetic image detection device according to the present invention. In this magnetic image detection device, electrodes 20 and electrodes 21 are provided at even alternating intervals perpendicular to and on superconducting body 19, said electrodes 20, 21 dividing superconducting body 19. Said electrodes 20 correspond to electrodes 12 in the aforementioned preferred embodiment, and electrodes 21 corresponds to electrodes 13. Therefore, this magnetic image detection device may be thought of as an embodiment in which the superconducting bodies 11, electrodes 12, and electrodes 13 of the magnetic image detection device in FIG. 3 are rotated 90 degrees.

Conventionally, a superconducting body is difficult to manufacture with high precision. On the other hand, the electrode can be manufactured with high precision. Therefore, the detection precision of the magnetic image detection device in FIG. 3 and FIG. 4 is determined by the gap between superconducting bodies 11, which are manufactured with low processing precision, and it is not possible to achieve high detection precision. On the other hand, the detection precision of the magnetic image detection device in FIG. 5 is determined by the gap between electrodes 20, 21, which are manufactured with high processing precision, and the detection precision can therefore be made even higher.

The aforementioned magnetic image detection device can detect magnetic field distribution in one dimension as hereinbefore described. By moving each of the magnetic image detection devices in a second direction by a drive device not shown in the figures, magnetic images in a second dimension space can be easily detected. Furthermore, by applying this magnetic image detection device which can detect magnetic images in a second dimension space, magnetic patterns can be detected by combining said device with a magnetic lens.

A magnetic image detection device which can detect magnetic images in the aforementioned second dimension space scans a first direction by means of electronic scanning, and scans in a second direction by means of mechanical scanning. However, it is also possible to apply electronic scanning for scanning in both the first and second directions.

Figure 7:
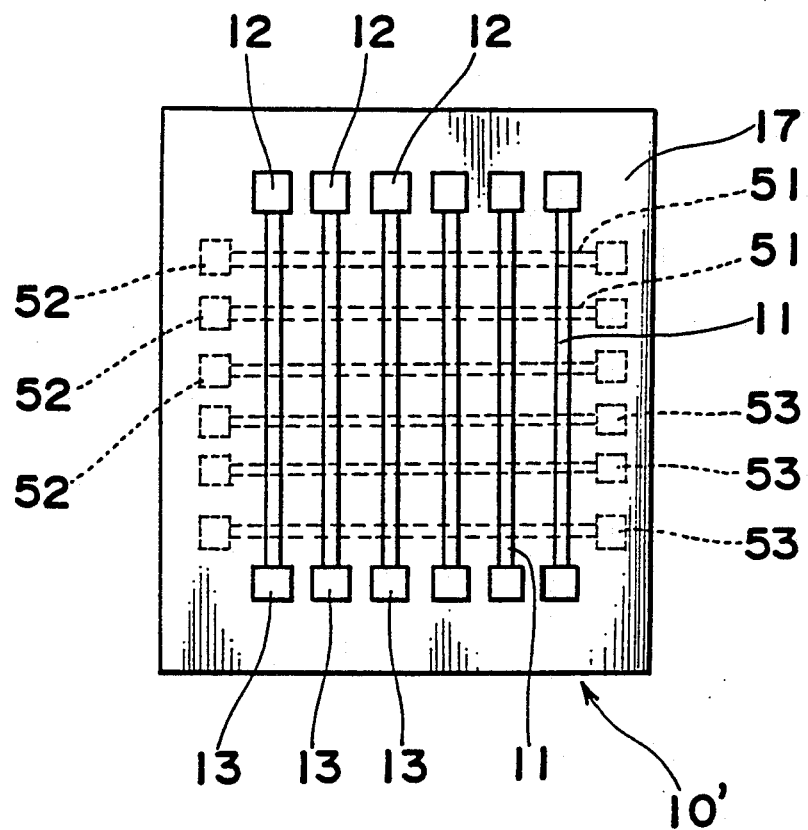
FIG. 7 is a top view of a first embodiment of a magnetic detection element of the digitizer shown in FIG. 6.

Specifically, the thickness of nonmagnetic dielectric substrate 17 of a magnetic image detection device constructed as shown in FIG. 1 is formed in such a manner as to be thin. Then, as shown in FIG. 7, on the back of this nonmagnetic dielectric substrate 17 are formed superconducting bodies 51 having electrodes 52, 53 on both ends in the same manner as on the front and arrayed in such a manner as to be perpendicular to the direction of the superconducting bodies 11 on the front. In other words, the magnetic field distribution in one direction is electronically detected by the superconducting bodies 11 arrayed in one direction, and the magnetic field distribution in the second direction is electronically detected by the superconducting bodies 51 arrayed in the other direction.

Furthermore, a magnetic image detection device which applies electronic scanning in both directions may be so constituted as described below. Specifically, two magnetic image detection devices comprised of a structure as shown in FIG. 1 and formed on a thin sheet nonmagnetic dielectric substrate 17 are prepared. Then, as shown in FIG. 8, the sides of the nonmagnetic dielectric substrates 17 on which are not provided the superconducting bodies 11 of the two magnetic image detection devices are applied face to face in such a manner that the directions of the superconducting body arrays on each substrate are perpendicular to one another.

In both of the aforementioned cases, detection circuit 14 includes a built-in switch so as to select and detect the distribution of the magnetic field acting on the superconducting bodies of the front or to select and detect the distribution of the magnetic field acting on the superconducting bodies of the back. It is to be noted that an external switch may also be provided to select the front or the back side. Furthermore, a detection circuit may also be provided each on the front and the back sides.

A magnetic image detection device thus constituted for electronic scanning in two directions is able to obtain magnetic images of two dimensions with high density, high precision, and this is done at high speed.

Figure 8:
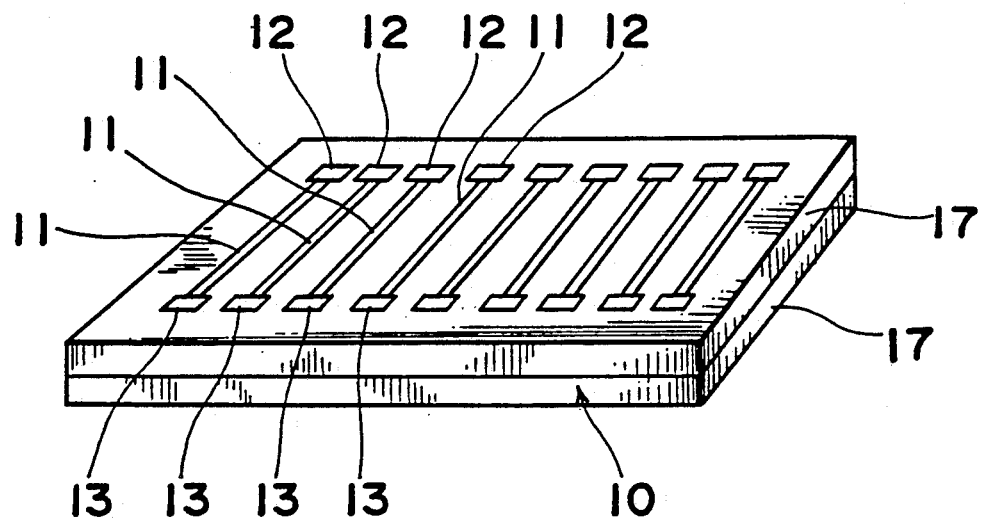
FIG. 8 is an oblique view of an alternative embodiment of the magnetic detection element in the aforementioned digitizer.

It is also extremely effective to use a magnetic image detection device thus constituted as shown in FIG. 7 and FIG. 8 for two directional electronic scanning in a digitizer. Specifically, a detection coil is built in to the cursor (magnetic pen) of conventional digitizers. Therefore, a lead wire for this detection coil is present on such conventional magnetic pens, making them hard to use.

Figure 6:
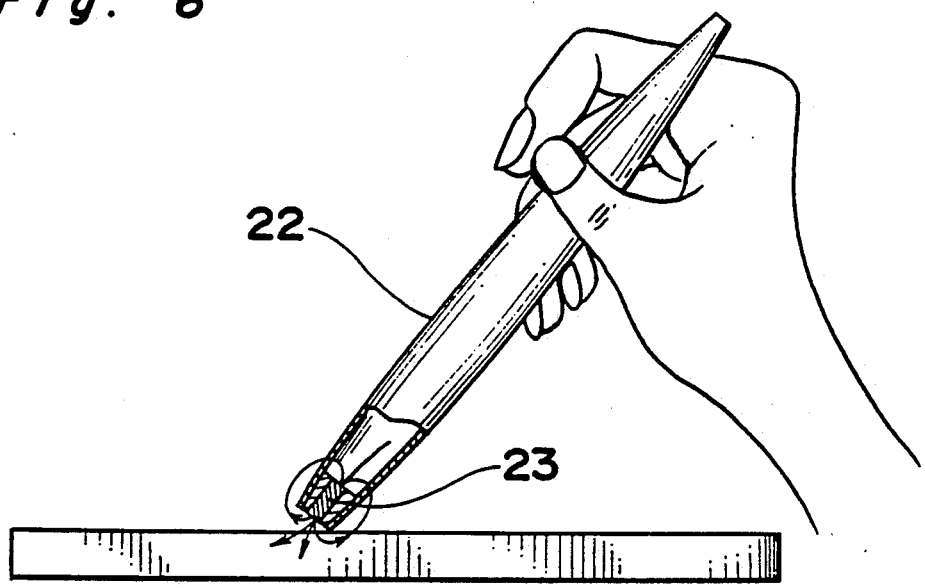
FIG. 6 is a view showing a digitizer according to the present invention.

However, in a digitizer using a magnetic image detection device according to the present invention, a wireless magnetic pen 22 in which a compact, powerful magnet 23 is embedded in the tip as shown in FIG. 6 can be used. When the magnetic pen 22 having a magnet in the tip is brought near a magnetic image detection device constituted as previously described to electronically scan in two directions, a resistance appears in the superconducting body 11 at the position of this magnetic pen 22 due to the magnetic field from magnet 23 of magnetic pen 22, and by detecting the voltage between electrodes 12, 13 on both ends of superconducting body 11 the position (specifically, the position indicated by magnetic pen 22) of the magnetic field can be detected.

Figure 9:
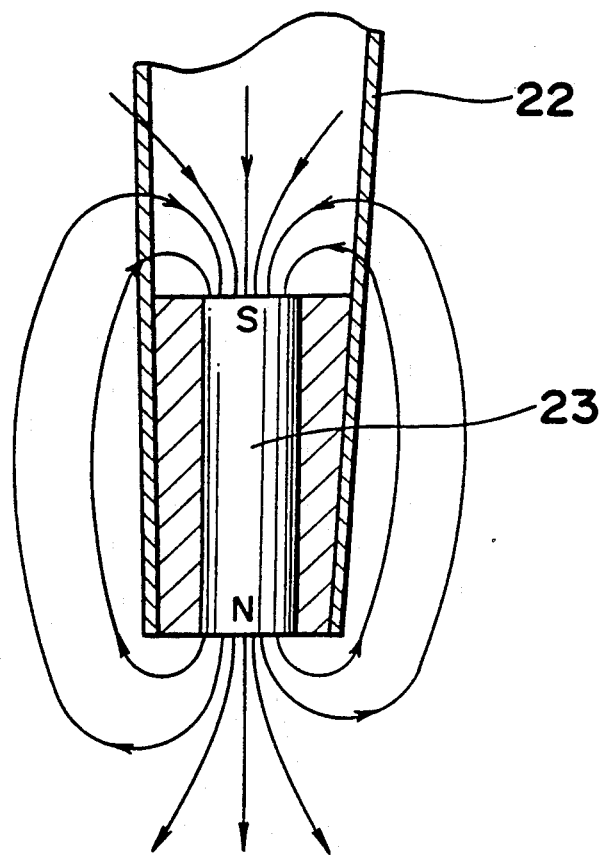
FIG. 9 is an enlarged view of the tip of the magnetic pen of the digitizer shown in FIG. 6, FIG. 10 and FIG. 11 are descriptive views of pens.

In the case in which the magnetic pen 22 simply has a magnet 23 provided at the end as shown in FIG. 9, the spread of the magnetic field from the tip of magnetic pen 22 is fairly large. Therefore, if the distance from the tip of magnetic pen 22 to the superconducting bodies 11 of the magnetic image detection device is great, the precision with which the position indicated by magnetic pen 22 is detected deteriorates.

Figure 10:
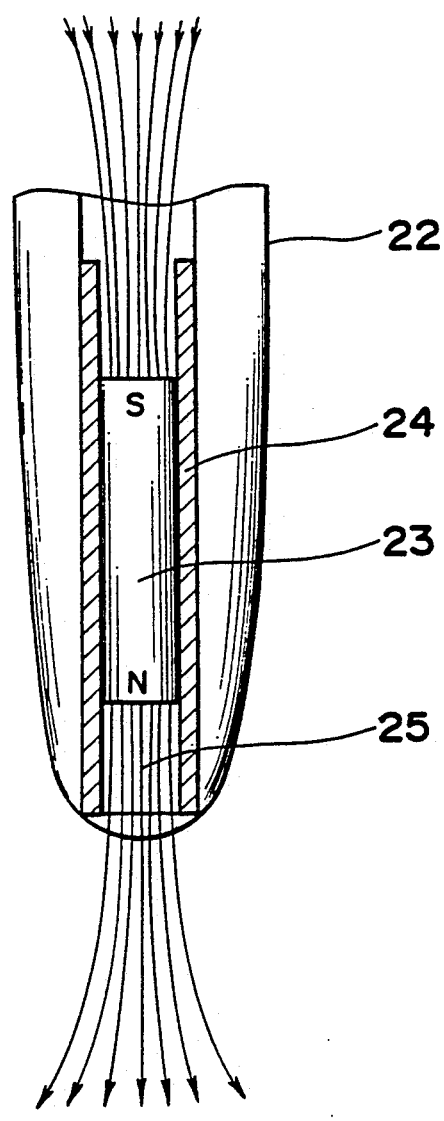

In FIG. 10 is shown a magnetic pen 22 in which the magnet 23 is enclosed within a sleeve 24 comprised of a superconducting body. The diffusion of the magnetic field in this case is reduced by the Meissner effect of sleeve 24 comprised of a superconducting body, and precision improves significantly.

Figure 11:
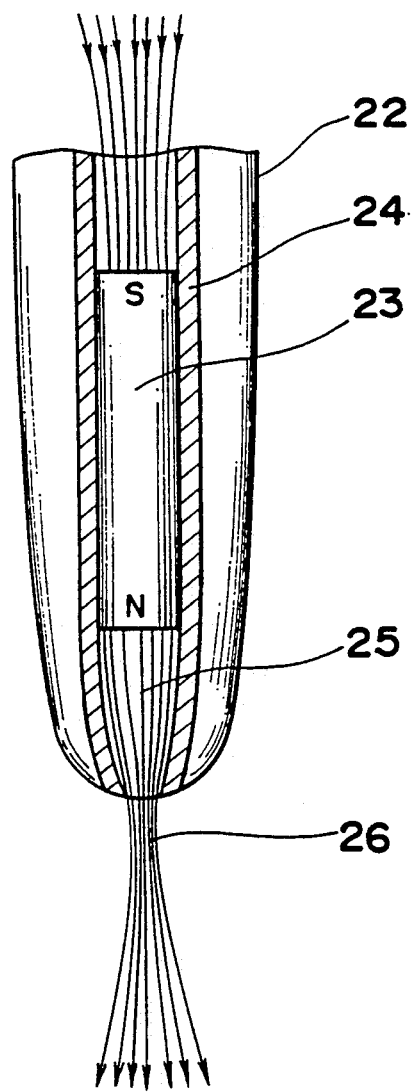

In FIG. 11 is shown an alternative magnetic pen 22 in which the tip of the sleeve 24 comprised of a superconducting body is constricted to reduce the diffusion of the magnetic field at the pen tip. The space 25 at which the tip of sleeve 24 is constricted may be left as an open space, but into the tip may also be injected an epoxy resin or other nonmagnetic body not shown in the figure to protect sleeve 24 and to prevent the entry of foreign matter into the pen tip. In a pen so constructed, the waist 26 at which the magnetic flux density is narrowest can be positioned at a point separated from the tip of magnetic pen 22. Therefore, detection precision does not drop even if a nonmagnetic protective sheet is placed between superconducting bodies 11 and magnetic pen 22.

Figure 12:
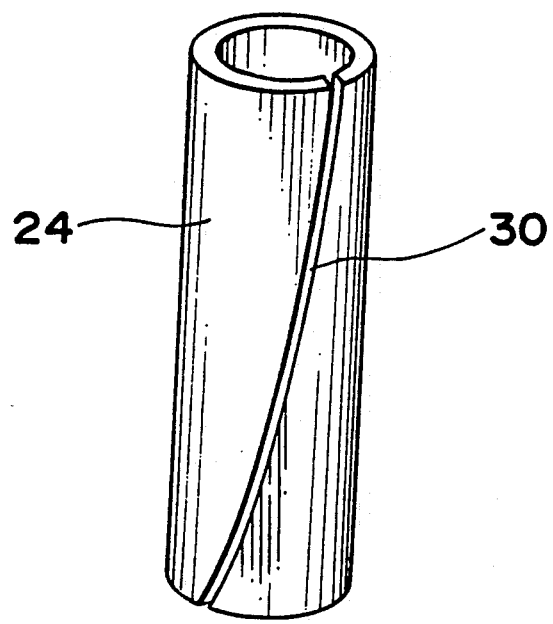
FIG. 12, FIG. 13 and FIG. 14 are views showing alternative embodiments of the aforementioned sleeve.
Figure 13:
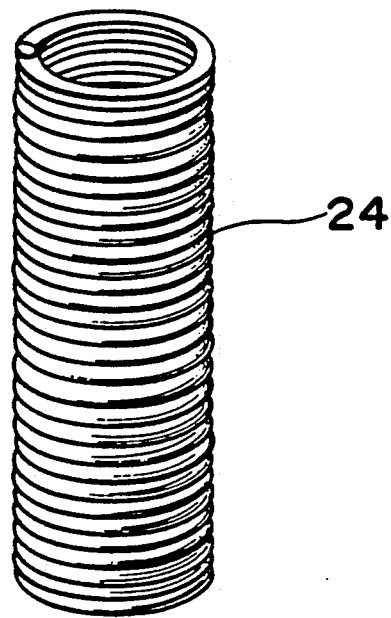

In FIG. 12 is shown a device in which a notch 30 is provided in part around the sleeve 24 so as to prevent a magnetic field cancelling current from flowing in the circumferential direction of sleeve 24 and weakening the intensity of the magnetic field. The notch 30 may slope in the lengthwise direction as shown in FIG. 12, and may be vertical. Furthermore, it may also have a swatch configuration. Moreover, as shown in FIG. 13, sleeve 24 may also be comprised of a wire of a superconducting body coated on the surface with an insulation material and tightly wrapped in a helipad pattern.

Figure 14:
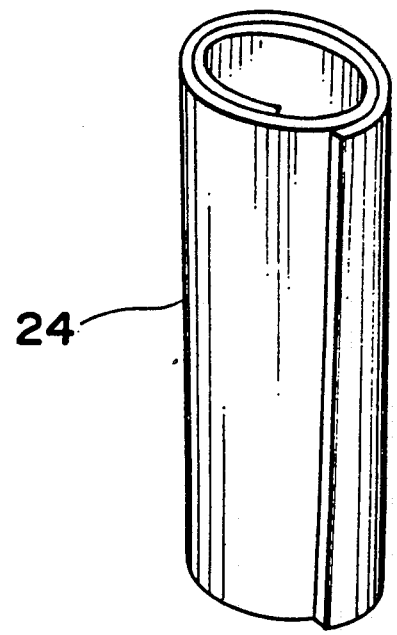

Furthermore, as shown in FIG. 14, said sleeve 24 may be formed by rolling multiple times a sheet material of a superconducting body provided with an insulation material on one side.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A magnetic image detection device comprising:
   one or more superconductor bodies provided on a nonmagnetic dielectric substrate;
   each superconducting body is elongated to form a single stripe, and a first electrode and second electrode are alternatively provided at even intervals and on top of each superconducting body; and
   a detection circuit which detects separately electrical resistance between the first electrode and the second electrode of each superconductive body;
   whereby a distribution in the first dimension of magnetism acting upon the superconducting body is detected by the detection circuit.

2. A magnetic image detection device as claimed in claim 1, wherein the first electrode and second electrode are provided extending in different directions alternatively on both sides of each superconducting body.

3. A magnetic image detection device comprising:
   plural superconducting bodies mounted on a nonmagnetic dielectric substrate;
   a first electrode and a second electrode at each end of each plural superconducting bodies;
   said superconducting bodies being elongated in one direction and arranged at even intervals in a direction which intersects the one direction;
   a detection circuit connected to said superconducting bodies which detects separately electrical resistance between each of said electrodes whereby distribution in the first dimension of magnetism acting upon the superconducting bodies is detected by the detecting circuit;
   said superconducting bodies are divided into multiple blocks;
   said blocks provided with diodes and resistors, and switches which switch the first electrodes of each of the blocks to a ground or a common power supply of a specified voltage, each of said diodes and resistors being joined to each line connecting the second electrodes to a common power supply having the same voltage as that of the specified voltage, whereby the first electrodes of each of the blocks are successively connected by the switches to the ground, thereby detecting a magnetic distribution at each block.

4. A digitizer comprising:
   a magnetic pen having a magnet installed inside a tip thereof;
   multiple first superconducting bodies provided on a surface of a nonmagnetic dielectric substrate, elongated in one direction and arranged at even intervals in a direction which intersects with the one direction;
   multiple first electrodes provided on one end of each of the multiple first superconducting bodies and multiple second electrodes provided on the other end of each of the multiple first superconducting bodies so as to form pairs with the multiple first electrodes;
   multiple second superconducting bodies provided on a back of the nonmagnetic dielectric substrate, elongated in the other direction and arranged at even intervals in the direction thus intersecting with the said other direction and such that the multiple second superconducting bodies are perpendicular to the first superconducting bodies;
   multiple third electrodes provided on one end of each of the multiple second superconducting bodies;
   multiple fourth electrodes provided on the other end of each of the multiple second superconducting bodies so as to form pairs with the third electrodes; and
   a detection circuit which detects electrical resistance between the first and second electrodes forming pairs and electrical resistance between the third and fourth electrodes forming pairs;
   whereby changes in resistance of the first and second superconducting bodies caused by magnetic flux coming from the magnetic pen are detected by the detection circuit, and the second dimension position of the magnetic pen is detected.

5. A digitizer as claimed in claim 4, wherein a sleeve of a superconducting body is provided around the magnet, thus reducing diffusion of magnetic field at the tip of the magnetic pen.

6. A digitizer as claimed in claim 5 wherein the sleeve of a superconducting body becomes narrower at the tip on the end of the magnetic pen.

7. A digitizer as claimed in claim 6, wherein a nonmagnetic body is injected into space at the tip end side of the magnet in the sleeve of a superconducting body.

8. A digitizer as claimed in claim 5, wherein a notch is provided on long side of the superconducting sleeve.

9. A digitizer as claimed in claim 5, wherein the sleeve of a superconducting body is formed with a superconducting wire material coated with an insulation material on surface tightly wrapped in a helical pattern.

10. A digitizer as claimed in claim 5, wherein the sleeve of a superconducting body is formed from a sheet of a superconducting material provided with an insulation material on one side and rolled multiple times.

11. A digitizer comprising:
    a magnetic pen having a magnet installed inside a tip thereof;

multiple first superconducting bodies provided on a surface of a nonmagnetic dielectric substrate, elongated in one direction and arranged at even intervals in a direction which intersects with the one direction;

multiple first electrodes provided on one end of each of the multiple first superconducting bodies and multiple second electrodes provided on the other end of each of the multiple first superconducting bodies so as to form pairs with the multiple first electrodes;

multiple second superconducting bodies provided on a separate nonmagnetic dielectric substrate, elongated in the other direction and arranged at even intervals in the direction thus intersecting with the said other direction;

multiple third electrodes provided on one end of each of the multiple second superconducting bodies;

multiple fourth electrodes provided on the other end of each of the multiple second superconducting bodies so as to form pairs with the third electrodes; and a detection circuit which detects electrical resistance between the first and second electrodes forming pairs and electrical resistance between the third and fourth electrodes forming pairs;

back sides of both of the nonmagnetic dielectric substrates being applied together in such a manner that a direction in which the first superconducting bodies are arrayed and a direction in which the second superconducting bodies are arrayed are perpendicular;

whereby changes in resistance of the first and second superconducting bodies caused by magnetic flux coming from the magnetic pen are detected by the detection circuit and the second dimension position of the magnetic pen is detected.

12. A digitizer as claimed in claim 11, wherein a sleeve of a superconducting body is provided around the magnet, thus reducing diffusion of magnetic field at the tip of the magnetic pen.

13. A digitizer as claimed in claim 12, wherein the sleeve of a superconducting body becomes narrower at the tip on the end of the magnetic pen.

14. A digitizer as claimed in claim 13, wherein a nonmagnetic body is injected into space at the tip end side of the magnet in the sleeve of a superconducting body.

15. A digitizer as claimed in claim 12, wherein a notch is provided on long side of the superconducting sleeve.

16. A digitizer as claimed in claim 12, wherein the sleeve of a superconducting body is formed with a superconducting wire material coated with an insulation material on surface tightly wrapped in a helical pattern.

17. A digitizer as claimed in claim 12, wherein the sleeve of a superconducting body is formed from a sheet of a superconducting material provided with an insulation material on one side and rolled multiple times.

18. A magnetic detection device comprising:

at least one superconducting body provided on a nonmagnetic dielectric substrate;

said at least one superconducting body having a first electrode and a second electrode; and a detection circuit mounted on said nonmagnetic dielectric substrate and connected to said electrodes.

19. The device of claim 18 wherein said detection circuit includes a complementary metal oxide semiconductor.

20. A magnetic image detection device comprising:

plural superconducting bodies provided on a nonmagnetic dielectric substrate, the plural superconducting bodies being elongated in one direction and arranged at even intervals in a direction which intersects with the one direction;

first electrodes and second electrodes, each of a first electrode and said second electrode being provided on both ends of each of the superconducting bodies;

a detection circuit connected to said electrodes which detects separately electrical resistance between the first electrode and second electrode whereby a distribution in the first dimension of magnetism acting upon the superconducting bodies is detected by the detection circuit.

21. A magnetic image detection device comprising:

plural superconducting bodies that form multiple parallel strips provided on a non-magnetic dielectric substrate, the plural superconducting bodies being elongated in one direction and are arranged at even intervals in a direction which intersects with the one direction;

first electrodes and second electrode, each of a first electrode and second electrode being provided on both ends of the superconducting bodies;

a detection circuit connected to said electrodes which detects separately electrical resistance between the first electrodes and the second electrodes, whereby a distribution in the first dimension of magnetism acting upon the superconducting bodies is detected by the detection circuit.

22. A magnetic image detection device comprising:

plural superconducting bodies being of a zig-zag pattern on a non-magnetic dielectric substrate the plural superconducting bodies being elongated in one direction and are arranged at even intervals in a direction which intersects with the one direction;

first electrodes and second electrodes each of a first electrode and second electrode being provided on both ends of each of the superconducting bodies;

a detection circuit connected to said electrodes which detects separately electrical resistance between the first electrodes and the second electrodes whereby a distribution in the first dimension of magnetism acting upon the superconducting bodies is detected by the detection circuit.

* * * * *